(12) United States Patent
Jean et al.

(10) Patent No.: US 6,407,639 B1
(45) Date of Patent: Jun. 18, 2002

(54) RADIO FREQUENCY DEVICE INCLUDING A POWER AMPLIFIER CIRCUIT AND A STABILIZER CIRCUIT, AND MOBILE TRANSCEIVER TERMINAL INCLUDING SUCH A DEVICE

(75) Inventors: Patrick Jean, Orsay; Pascal Talbot, Malakoff, both of (FR)

(73) Assignee: Koninklijke Philips Electronics N.V. (NL)

( * ) Notice: Subject to any disclaimer, the term of this patent is extended or adjusted under 35 U.S.C. 154(b) by 0 days.

(21) Appl. No.: 09/318,332

(22) Filed: May 25, 1999

(30) Foreign Application Priority Data

Jun. 3, 1998 (FR) .............................. 98 06965

(51) Int. Cl.$^7$ .............................. H03F 1/52; H03F 1/30
(52) U.S. Cl. ....................................... 330/298; 330/290
(58) Field of Search .......................... 330/207 P, 285, 330/290, 297, 298

(56) References Cited

U.S. PATENT DOCUMENTS

| | | | | |
|---|---|---|---|---|
| 4,547,746 A | | 10/1985 | Erickson et al. ............ 330/298 |
| 4,849,712 A | * | 7/1989 | Jarrett .................... 330/290 X |
| 5,497,125 A | * | 3/1996 | Royds .................... 330/298 X |
| 6,025,754 A | * | 2/2000 | Czora .................... 330/298 X |
| 6,064,269 A | * | 5/2000 | Ruppel et al. ............. 330/297 |

OTHER PUBLICATIONS

By Lawrence E. Larson, "Integrated Circuit Technology Options for RFIC's—Present Status and Future Directions" IEEE Journal of Solid–State Circuits, vol. 33, No. 3, Mar. 1998.

* cited by examiner

Primary Examiner—Steven J. Mottola
(74) Attorney, Agent, or Firm—Dicran Halajian

(57) ABSTRACT

A radio frequency device and mobile terminal having this device, includes a power amplifier (PA) for radio frequency signals ($I_{RF}$, $O_{RF}$) and a stabilizer (STB) for controlling power variations of the radio frequency output signal ($O_{RF}$) as a function of variations of a reference voltage ($V_{CON}$). The stabilizer is equal to a nominal resistance ($R_N$) having a predetermined value as a function of an isopower curve (H, $D_H$) of the power amplifier and generates for the power amplifier a supply voltage ($V_{PA}$) in dependence on the reference voltage ($V_{CON}$) and the nominal resistance ($R_N$), so that the power consumption ($P_{PA}$) and output power ($P_{OUT}$) are independent of the real internal resistance ($R_{PA}$) of the power amplifier.

10 Claims, 4 Drawing Sheets

RADIO FREQUENCY DEVICE INCLUDING A POWER AMPLIFIER CIRCUIT AND A STABILIZER CIRCUIT, AND MOBILE TRANSCEIVER TERMINAL INCLUDING SUCH A DEVICE

FIELD OF THE INVENTION

The invention relates to a radio frequency device including a power amplifier circuit having an input and an output for radio frequency signals and having DC supply terminals, and including a power stabilizer circuit for controlling variations of the power of the radio frequency output signal of the power amplifier as a function of variations of a reference voltage.

The invention also relates to a mobile transceiver terminal including such a device, and, more particularly, a cellular mobile terminal.

It will be recollected that in a mobile transceiver terminal it is necessary to associate to the transceiver circuit a circuit that makes it possible to let the transmit power vary within limits as a function of a variable reference voltage. Actually, a mobile transceiver terminal cooperates with a base station whose distance to the mobile terminal varies when the user of the mobile terminal moves about. The transmit power of the mobile terminal depends on this distance for the base station to have a proper reception. A protocol generated by the base station is capable of informing the mobile terminal of the proper power level that the transmission system of the mobile terminal is to produce to avoid the saturation of the receiving system of the base station, taking this distance into account. The mobile terminal is thus to comprise a control circuit for controlling the transmitted power, so that this power corresponds to the proper power required by the base station.

A cellular mobile terminal is nowadays a consumer transceiver device which the conceiver of ideas seeks to make as light as possible and also as inexpensive as possible for an attractive, current and easy use. The circuits accommodated in the housing of the mobile terminal are thus to be small, inexpensive and highly reliable.

BACKGROUND OF THE INVENTION

From the publication: "Integrated Circuit Technology Options for RFICs-Present Status and Future Directions", pages 387–389, in IEEE journal of SOLID-STATE CIRCUITS, vol. 33, no. 3, March 1998, by Lawrence E. Larson, a device has already been known to include a power stabilizer of a power amplifier circuit that operates via the DC supply voltage control. This device comprises a power amplifier circuit whose output is connected by a coupler to an antenna and a power detector. This device further includes a control amplifier which receives an external DC control voltage called reference voltage and which applies a DC reference voltage to a stage that produces the DC supply voltage. The power detector also applies an input voltage to the control amplifier. Thus, the supply voltage of the power amplifier is slaved by a loop to a value so that there is agreement between the information produced by the power detector and the reference voltage that corresponds to the control voltage. In a mobile terminal, the control voltage is received by a processor which repeats the reference voltage transmitted by the base station.

SUMMARY OF THE INVENTION

A problem is that this device including the stabilizer circuit and power amplifier circuit generally has a poor performance due to the dispersions when the circuit elements are manufactured. More particularly, the power amplifier has highly dispersed characteristic features. By way of example, certain amplifiers can produce a power of 1 W, whereas other power amplifiers can produce a power of 1.5 W for the same DC supply voltage. Another problem is that this device needs the presence of a coupler which is a bulky and not very reliable element. Owing to these problems, this known device is not very suitable for use in a mobile terminal.

It is an object of the invention to provide a device that includes a power stabilizer circuit for a power amplifier circuit and does not have these problems. More particularly, it is an object of the present invention to provide a device whose output power is independent of the manufacturing dispersion of the circuit elements and which does not need the use of a coupler.

This object is achieved and the problems are solved with a device that is based on the evaluation of the efficiency of the power amplifier which is a stable characteristic feature, slightly affected by the manufacturing dispersions of the power amplifier. As a result, there is the advantage that the output power of the amplifier is well controlled. Moreover, this device offers the advantage of being simple and compact.

BRIEF DESCRIPTION OF THE DRAWINGS

These and other aspects of the invention will be apparent from and elucidated with reference to the embodiments described hereinafter.

In the drawings.

DESCRIPTION OF PREFERRED EMBODIMENTS

Figure 1A:
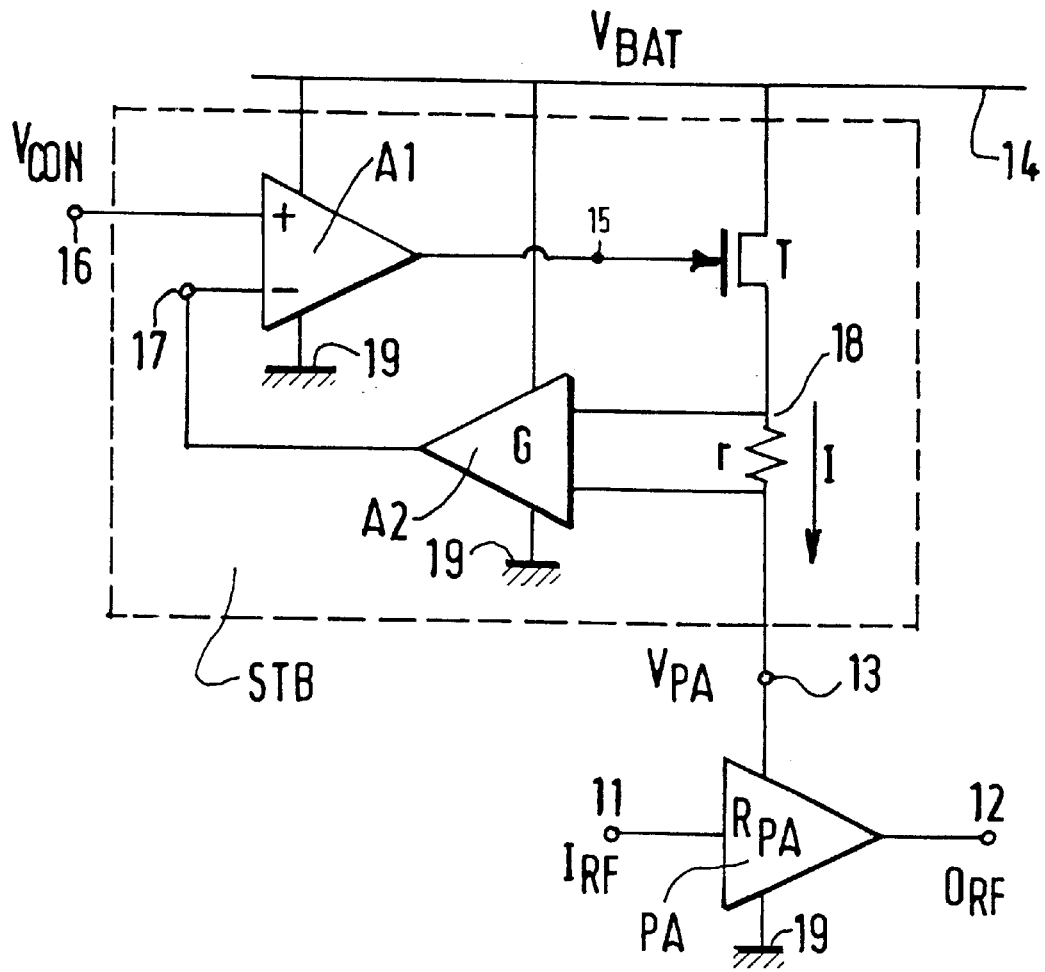
FIG. 1A represents in a simplified form a radio frequency device with a power amplifier circuit and a stabilizer circuit.

With reference to FIG. 1A, the invention relates to a radio frequency device that includes a power amplifier circuit PA and a stabilizer circuit STB for regulating, controlling and stabilizing the output power denoted $P_{OUT}$ of the power amplifier circuit PA as a function of a DC voltage having a variable value $V_{CON}$ called reference voltage imposed by an additional circuit (not shown).

The power amplifier circuit PA is supplied with a DC voltage $V_{PA}$ applied between the node 13 and ground 19. The power amplifier PA has an internal resistance $R_{PA}$. This amplifier further has an input 11 for a radio frequency input signal $I_{RF}$ and an output 12 for an amplified radio frequency output signal $O_{RF}$ which has the output power $P_{OUT}$.

The output power $P_{OUT}$ of the power amplifier PA at the node 12 is to be a function that varies along with the reference voltage $V_{CON}$. The stabilizer circuit STB has for its function to regulate the output power $P_{OUT}$ of the power amplifier PA as a function of the DC reference voltage $V_{CON}$.

A problem is that for a considered application of the transceiver device to a mobile terminal, the circuits are to be very compact. Another problem is that, generally, the power amplifier PA shows performance dispersion due to the manufacture, which renders the regulation of the output power as a function of a reference voltage difficult.

With reference to FIG. 1A, the power stabilizer circuit STB applied to the power amplifier PA makes it possible to solve these problems. This stabilizer circuit STB of FIG. 1A comprises a first amplifier A1 which has a first input 16 for a DC signal of the positive reference voltage $V_{CON}$ and a negative second input 17 for a voltage produced on the output of a second amplifier A2. At 14 there is a fixed DC supply voltage $V_{BAT}$ which feeds the two amplifiers A1 and A2. The DC supply voltage $V_{BAT}$ is generally produced by a battery located in a housing accommodating the device, or also by a transformer system fed by a power grid. Other ways of generating $V_{BAT}$ are known to those skilled in the art. The stabilizer circuit STB further includes a transistor stage T, for example, a MOS transistor T working as a variable resistor. This transistor T receives on its gate electrode the DC output voltage 15 of the amplifier A1. Its drain electrode is connected at 14 to the DC supply voltage $V_{BAT}$ and its source electrode is connected at 18 to a positive input of the second amplifier A2. A second, negative, input 13 of this second amplifier A2 is such that there is a DC voltage $V_{PA}$ on the node 13. For this purpose;

the second amplifier A2 has a gain G,
a low-value resistance r is connected between the node 18 shared by the source of the transistor T and the positive input of the second amplifier A2, and the node 13 which is the negative input of this second amplifier A2 and at the same time the DC supply terminal $V_{PA}$ of the power amplifier PA.

Arranged in this manner, the stabilizer circuit STB forms a loop between the input 16 for the reference voltage $V_{CON}$ and the node 13 where the DC supply voltage $V_{PA}$ of the power amplifier PA is available.

Figure 1B:
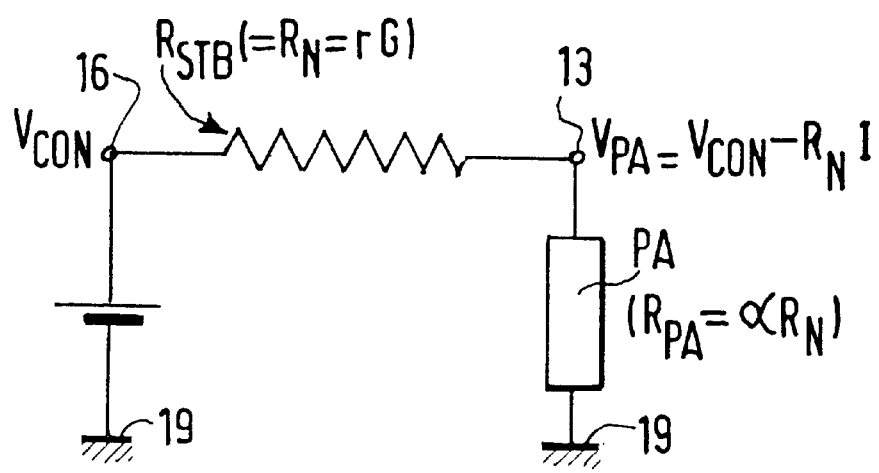
FIG. 1B is an equivalent circuit diagram of the device of FIG. 1A.

The circuit of FIG. 1A is equivalent to that of the diagram of FIG. 1B. This equivalent circuit comprises a voltage generator between the nodes 16 and 19 and generates the reference voltage $V_{CON}$, a resistance equivalent to the stabilizer circuit denoted $R_{STB}$ which is such that:

$$R_{STB}=r\times G,$$

to which is given a specific value:

$$R_{STB}=R_N,$$

in which a current I flows and which is connected between the nodes 16 and 13. The power amplifier PA is equivalent to a load impedance $R_{PA}$ that has a value that is equal to its internal resistance, connected between the nodes 13 and 19, in which also the current I flows. At 13, there is the DC supply voltage $V_{PA}$ for the power amplifier PA.

Figure 2A:
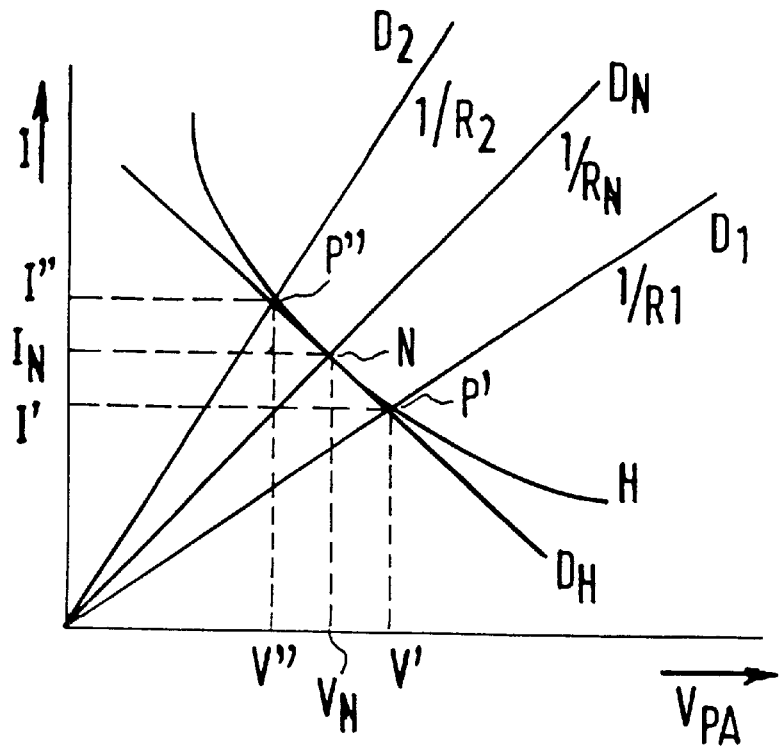
FIGS. 2A and 2B represent characteristic curves of the amplifier circuit.

FIG. 2A represents characteristic curves of current I plotted against the voltage $V_{PA}$ of the power amplifier working in the saturation mode. These characteristic curves are nearly straight lines in this case. A first average characteristic curve called nominal characteristic curve is represented in the form of the straight line $D_N$ for an amplifier that has an average power consumption denoted $P_{PA}$, this amplifier being called average power amplifier when leaving the works. For determining the nominal characteristic curve $D_N$ of an average power amplifier PA, statistics have for example been realized of a number of amplifiers during a pre-development stage in their manufacture. The slope of the nominal characteristic curve $D_N$ is equal to $1/R_N$, where $R_N$ is the value of the internal nominal resistance of an average amplifier, so that $R_{PA}=R_N$ determined by such a statistical study. Hereinafter, this nominal characteristic curve $D_N$ and this nominal resistance $R_N$ are taken as references.

Because of the manufacturing dispersions, amplifiers PA may be found which have a lower power consumption and show a characteristic curve $D_1$, or also amplifiers PA which have a higher power consumption and show a characteristic curve $D_2$. The slopes of the characteristic curves $D_1$ and $D_2$ are equal, $1/R_1$, $1/R_2$ respectively, where $R_1$, $R_2$ are internal resistances of the power amplifiers which have the respective characteristic curves $D_1$ and $D_2$. The amplifier having characteristic curve $D_1$ has a current consumption I' which is lower than the current consumption $I_N$ of the average amplifier having nominal characteristic curve $D_N$. And the amplifier having characteristic curve $D_2$ has a current consumption I" that is higher than the current consumption $I_N$ of this average amplifier which has nominal characteristic curve $D_N$. Thus, for the same given voltage $V_{PA}$, the amplifier that has characteristic curve $D_1$ has a lower power consumption and the amplifier that has characteristic curve $D_2$ has a higher power consumption than the average amplifier which has the nominal characteristic curve $D_N$.

Figure 3:
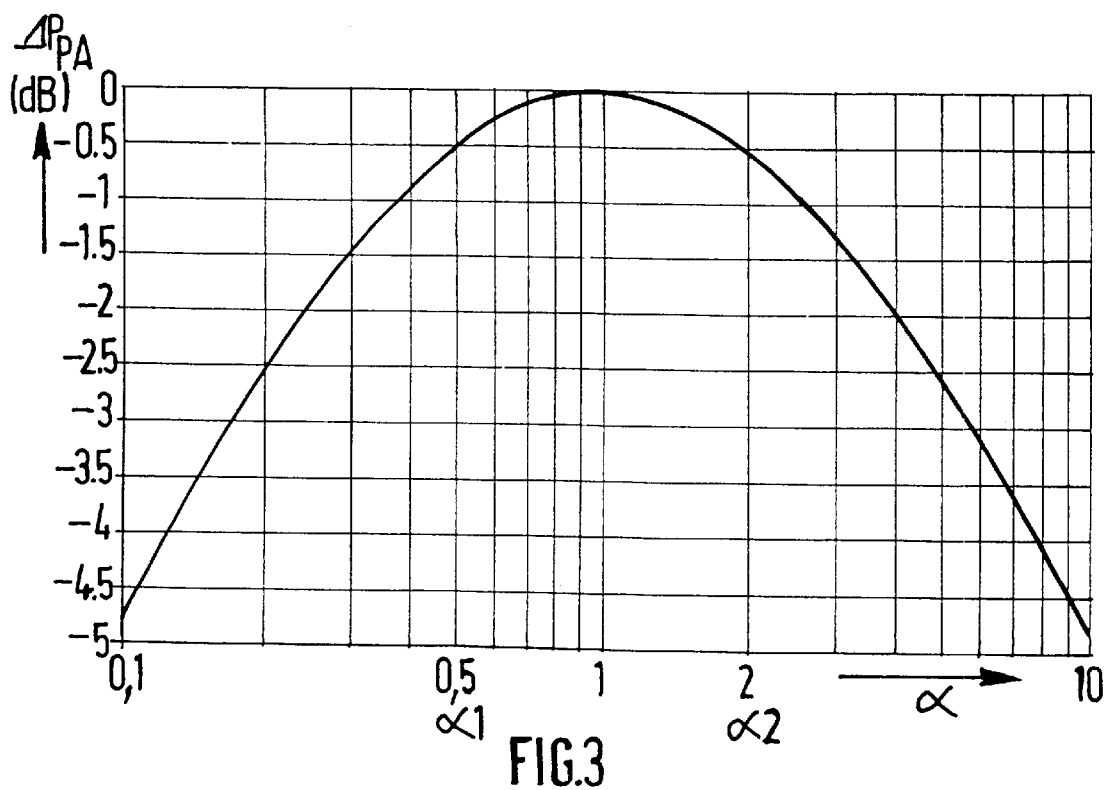
FIG. 3 represents the variations of the power consumption in the power amplifiers plotted against the manufacturing dispersion coefficient.

FIG. 3 shows a curve representing the difference of power consumption $\Delta P_{PA}$ of an arbitrary amplifier PA taken at random from a manufactured batch of amplifiers as against the average amplifier, relative to a multiplicand α called dispersion coefficient which, multiplied by the nominal resistance $R_N$, produces the internal resistance $R_{PA}$ of the arbitrary amplifier under consideration:

$$R_{PA}=\alpha R_N.$$

In the curve of FIG. 3, there may be determined by way of example that a possible difference of power consumption $\Delta P_{PA}=0.5$ dB relative to the average power consumption corresponds to a coefficient α lying between $\alpha_1=0.5$ and $\alpha_1=2$. When the coefficient α=1, one finds $\Delta P_{PA}=0$, which corresponds to the average power amplifier which has a nominal characteristic $D_N$ and a nominal resistance $R_N$.

According to the invention, the circuit of FIG. 1A does not include a power detector. This makes it possible to avoid the drawbacks observed with respect to the described prior-art circuit. It will be recollected that the output power $P_{OUT}$ of a power amplifier PA having whatever characteristic curve taken from the batch of manufactured power amplifiers is linked with the power consumption $P_{PA}$ inside this power amplifier PA via an efficiency value ã, so that the efficiency is:

$$\tilde{a}=P_{OUT}/P_{PA},$$

Figure 1C:
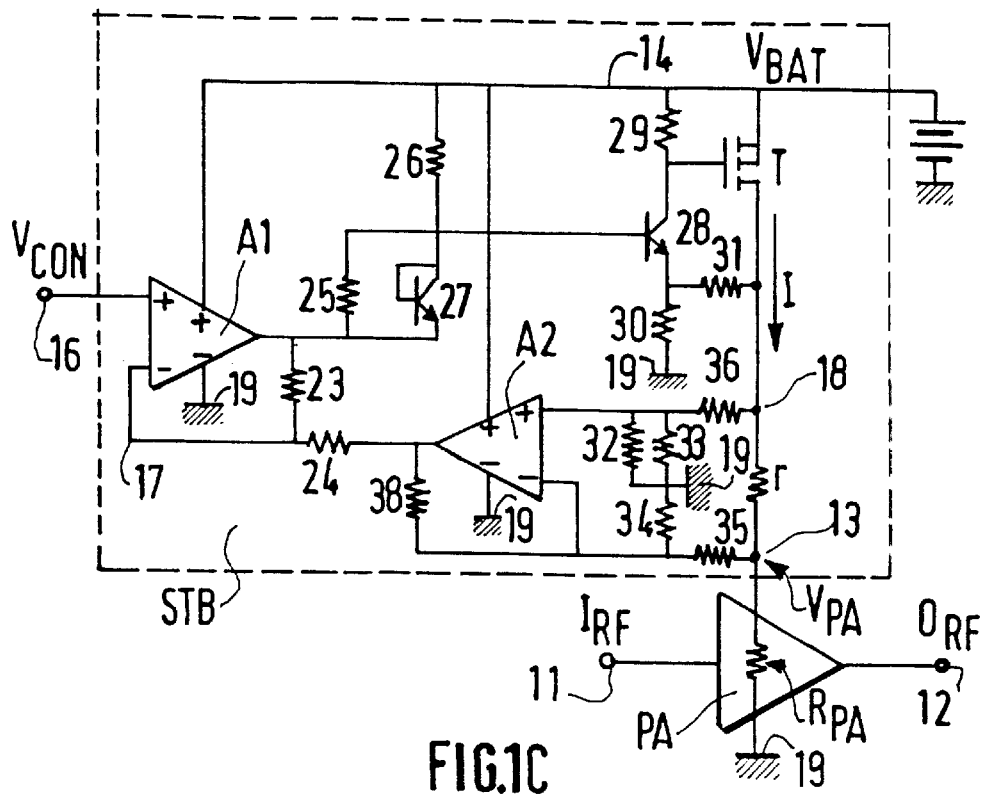
FIG. 1C represents the device of FIG. 1A with bias and feedback systems of the circuits.

It should be observed that in the type of power amplifier PA used in radio frequency integrated circuits, such as the circuits shown in FIGS. 1A to 1C, the efficiency ã is substantially constant whatever the power amplifier PA taken from a batch of manufactured power amplifiers.

According to the invention, the elements of the stabilizer circuit STB are determined for stabilizing the power consumption $P_{PA}$ of the power amplifier PA. Thus, the circuit STB of FIG. 1A makes it possible for the power consumption in the power amplifier PA to be substantially independent of manufacturing dispersions, that is to say, constant, whatever the power amplifier PA of a batch of manufactured power amplifiers, for a given reference voltage $V_{CON}$. Thus, thanks to the circuit STB, the power consumption $P_{PA}$ of the power amplifier PA is constant and as the efficiency a is constant, the result is that the output power $P_{OUT}$ is constant whatever the manufacturing dispersions of the power amplifier for a given reference voltage $V_{CON}$. For a given reference voltage $V_{CON}$, the output power $P_{OUT}$ of the power amplifier PA is rendered constant by means of the stabilizer circuit STB, whatever the internal resistance $R_{PA}$, its characteristic curve D and the dispersion coefficient α taken between predetermined limits $α_1$, $α_2$.

This object is achieved by constructing the stabilizer circuit STB with an equivalent internal resistance:

$$R_{STB=r \times G=RN}$$

as will be demonstrated hereinafter.

The power consumption $P_{PA}$ in the power amplifier PA is directly linked with its supply voltage $V_{PA}$ at node 13, and with the current I flowing in the power amplifier PA in the branch 13, 19. The stabilizer circuit STB makes it possible to adjust this supply voltage $V_{PA}$ and this current I in an effective manner. The power consumption in the power amplifier PA is thus constant when the product of the current I passing through this power amplifier PA and the DC supply voltage $V_{PA}$ on its terminals is constant:

$$P_{PA}=V_{PA} \times I.$$

The stabilizer circuit STB forms a loop that guarantees that the power consumption in the amplifier PA is constant whatever α. As the efficiency of a power amplifier PA is substantially constant, the result is that when the power consumption in the power amplifier PA is slaved, there is a guarantee that the output power $P_{ouT}$ of the radio frequency signal $O_{RF}$ is constant.

In the circuit of FIG. 1A, the power amplifier PA is connected between the terminals 13 and 19 to be fed with the DC voltage $V_{PA}$ that adjusts the power consumption $P_{PA}$ to the product of the current I and the voltage $V_{PA}$ concerned.

With reference to FIG. 1B, the equivalent resistor of the stabilizer circuit $R_{STB}$ is passed through by the current I and the voltage drop in this resistor is the product $R_N I$. The result is that the supply voltage of the power amplifier at the node 13 is given by $$V_{PA=VCON}-R_N I.$$

With reference to FIG. 2A, the spot where the product of the current and the voltage is exactly constant is a hyperbole represented by curve H which is called isopower hyperbole. The intersections of the hyperbole H and the characteristic curves $D_1$, $D_N$, $D_2$ of the power amplifier PA define pairs of current-voltage values I', $V'_{PA}$; $I_N$, $V_{NPA}$ and I", $V"_{PA}$, so that the power consumption which is the product of the current-voltage values of each pair is exactly constant.

For using the circuit of FIG. 1A, a straight line $D_H$ is considered which is tangential to the hyperbole H at the point N which is the intersection of the nominal characteristic curve $D_N$ and the isopower hyperbole H. This straight line $D_H$ defines by intersection with the characteristic curves $D_1$, and $D_2$ pairs of current-voltage values which substantially coincide with the pairs of current-voltage values I', $V'_{PA}$ and I", $V"_{PA}$ in the conditions where the characteristic curves $D_1$ and $D_2$ correspond to dispersion coefficients taken within the predetermined limits $α_1$, $α_2$. There is thus considered that the straight line $D_H$ which is tangential to the isopower hyperbole H is a good approximation of this hyperbole H on the segment bounded by the points $P'_{PA}$, $P"_{PA}$ which are situated at the intersection of these characteristic curves $D_1$, $D_2$ and the straight line $D_H$ and which correspond to acceptable extreme dispersion coefficients $α_1$, $α_2$. This segment on the straight line $D_H$ is a place where the power consumption $P_{PA}$ in the power amplifiers PA is substantially constant.

By using the approximation defined by the straight line $D_H$, and more particularly by the segment marked off by $D_1$, $D_2$, the elements of the stabilizer circuit STB are defined to achieve that the power consumption $P_{PA}$ in the power amplifier PA:

is constant for a given reference voltage $V_{CON}$ whatever the manufacturing dispersion of the power amplifier, within known or desired boundaries $α_1$, $α_2$ made concrete by the characteristic curves $D_1$, $D_2$, or is in accordance with the reference voltage $V_{CON}$ applied to the input 16 of the stabilizer circuit STB.

With reference to FIG. 1B, the equivalent resistance in the stabilizer circuit denoted $R_{STB}$ is rendered equal to the nominal value $R_N$, which resistance is arranged between the nodes 16 and 13 so that a current I is generated in the branch 14, 13 of the stabilizer circuit STB and the same current I in the branch 13, 19 of the power amplifier circuit. A very low value for the resistance r is selected, called small resistance, connected between the nodes 18 to the terminals of the amplifier $A_2$ having gain G, so that:

$$R_{N=r \times G}.$$

Figure 2B:
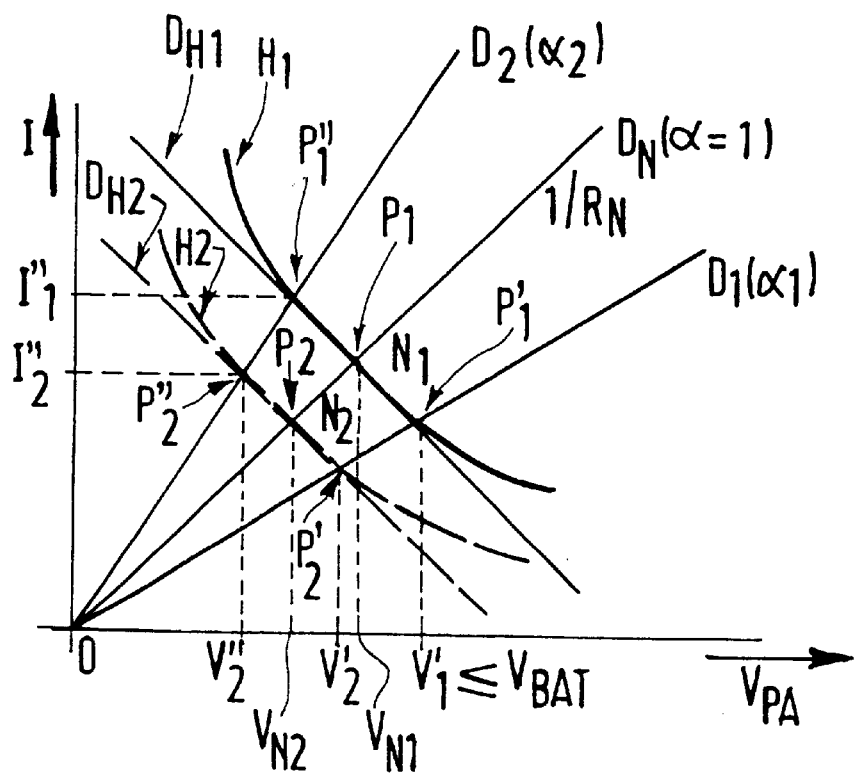

With reference to FIG. 2B, when the reference voltage $V_{CON}$ changes, the isopower curves move. On the one hand, for a first reference voltage $V_{CON}$ having a first value, the exact isopower curve is the hyperbole $H_1$ and the approximate isopower straight line is the tangent $D_{H1}$. On the other hand, for a second reference voltage $V_{CON}$, the exact isopower curve is the hyperbole $H_2$ and the approximate isopower straight line is the tangent $D_{H2}$. It is noted that the voltage $V_{PA}$ cannot exceed the value of the voltage of the battery $V_{BAT}$.

In FIG. 2B there is derived that for given reference voltages $V_{CON}$, the power amplifier PA has respective power consumptions $P_1$ and $P_2$ and so on in agreement with the reference voltages which are constant between the dispersion boundaries expressed by the coefficients $α_1$, $α_2$ which correspond to characteristic curves $D_1$, $D_2$. By way of example:

On $D_{H1}$, between $α_1$, and $α_2$, $P'_1=P"_1=P_1$,

On $D_{H2}$, between $α_1$, and $α_2$, $P'_2=P"_2=P_2$.

With reference to FIG. 1C, by way of example of a practical embodiment, the stabilizer circuit STB of FIG. 1A comprises:

a power stage for generating a current I which has sufficient value for the operation of the power amplifier PA, including the PMOS type transistor T, a transistor 28 and resistors 29, 30 and 31, a temperature compensation stage of the power stage including a transistor 27 arranged as a diode, a bias resistor 26 and a feedback resistor 25, an amplifier stage A1 with the input 16 for the reference voltage $V_{CON}$, a feedback resistor 23 and a connection resistor 24, an amplifier stage A2 having gain G, with a feedback resistor 38, an output 17 connected to the input of the amplifier A1, and a feedback formed by the resistor bridge 32, 33 and 34, on the one hand, and 35, 36 on the other, whose values are to be given as a function of the resistor 38 and with the resistance r having value 0.1 Ω, passed through by the current I between the nodes 13 and 18.

The following Table represents the values of the resistors of this example of embodiment:

| Number of resistors | Value in Ohms |
| --- | --- |
| 25, 33, 34, 35, 36 | 10 kΩ |
| 32, 38 | 220 kΩ |
| 23 | 15 kΩ |
| 26 | 47 kΩ |
| 29 | 1 kΩ |
| 24 | 18 kΩ |
| 30 | 47 Ω |
| 31 | 220 Ω |

The internal resistance of the power amplifier PA is of order of 10 Ω, the voltage $V_{BAT}$ at 14 is of the order of 3.6 volts. This voltage feeds the power stage with T, the temperature comensation stage, the amplifier stage A1 and the amplifier stage A2 having gain G. The voltage $V_{PA}$ at 13 is of the order of 3.5 volts.

By choosing the value of the resistance r small, for example, several 0.1 Ω, or rather of the order from $R_N/20$ to $R_N/200$, for example with $R_N$ of the order of 10 Ω, there is obtained that the power consumption in the stabilizer circuit STB is very low and that the voltage drop in the branch 14, 13 between $V_{BAT}$ and $V_{PA}$ is very small. The result is that, for example, with a battery of 3.6 volts it is possible to feed the power amplifier PA with a voltage $V_{PA}$ of the order of 3.5 volts. This represents a considerable saving on power consumption in the assembly of circuits of FIG. 1A. In fact, if the resistance between $V_{BAT}$ and $V_{PA}$ were really $R_N$, then the voltage $V_{BAT}$ would have to be over 6 volts in this example, and the power consumption in the circuit assembly of FIG. 1A would practically be doubled. The stabilizer circuit realized according to the invention thus offers a considerable advantage.

Figure 4:
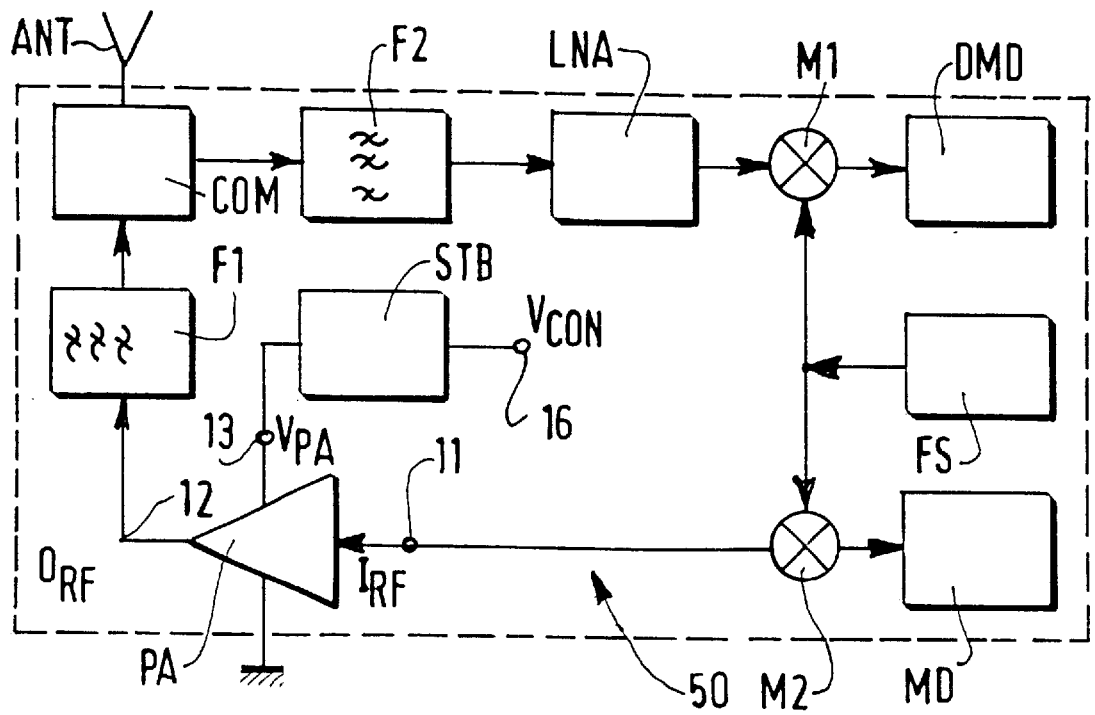
FIG. 4 represents a device including a radio frequency transceiver circuit.

FIG. 4 shows by way of non-exhaustive example, a radio frequency transceiver device including a power amplifier PA and a stabilizer STB as described with reference to FIGS. 1A or 1C. This device 50 comprises an antenna ANT, a loop with a filter F2, a low-noise amplifier LNA, a mixer M1, a demodulator DMD, a frequency synthesizer FS, a modulator MD, a second mixer M2, a terminal 11 for the radio frequency input signal IRF coming from M2, a power amplifier PA having an output 12 for the radio frequency output signal $O_{RF}$, a stabilizer STB having an input 16 for the set signal $V_{CON}$ and a terminal 13 for applying the supply voltage $V_{PA}$ to the power amplifier PA, a filter F1 and a switch COM connected to the two filters F1, F2 and to the antenna ANT. The operation of such a radio frequency circuit is well known to those skilled in the art and particularly from cited publication by way of prior art, with of course the fundamental difference of the power amplifier PA and the stabilizer STB according to the invention.

Such a circuit is preferably integrated in a technology permitting the operation at radio frequencies. An advantageous technology of embodiment of these integrated circuits is the technology utilizing gallium arsenide (GaAs).

Figure 5:
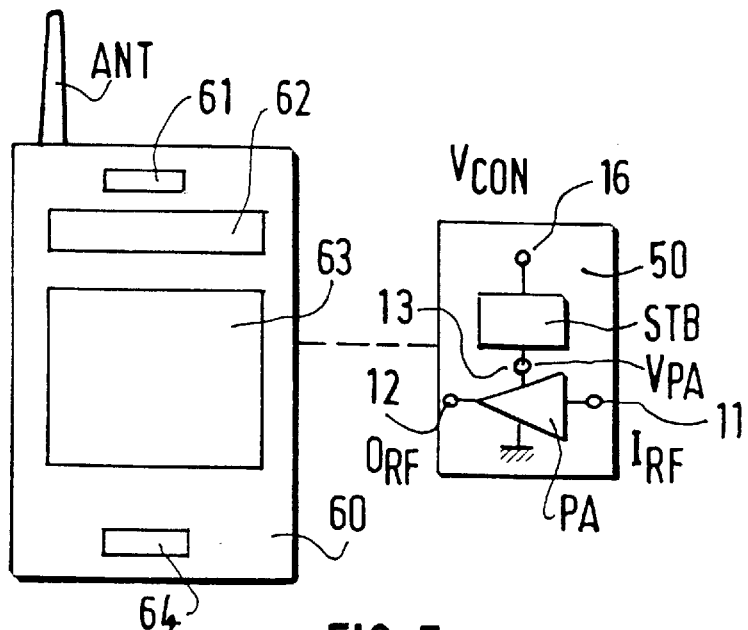
FIG. 5 represents a mobile transceiver terminal including a device as shown in one of the FIGS. 1A to 1C or FIG. 4.

FIG. 5 represents a mobile terminal device with a housing 60 for protecting a radio frequency device 50 with a power amplifier PA and a stabilizer STB according to the invention. The device 50 may advantageously be an integrated circuit and, particularly, an integrated circuit in GaAs technology. The housing has an antenna ANT, an earphone function 61, a microphone function 64, an area of control keys 63 and a display area 62.

What is claimed is:

1. A radio frequency device including a power amplifier circuit having an input and an output for radio frequency signals and having terminals for DC power supply, and including a stabilizer circuit for controlling variations of the power of the radio frequency output signal of the power amplifier as a function of variations of a reference voltage, characterized in that the stabilizer circuit is arranged to be equivalent to a resistance called nominal resistance having a predetermined value as a function of a specific isopower curve of the power amplifier and to generate on the DC power supply terminal of said power amplifier a voltage in dependence on the reference voltage and said nominal resistance, so that the power consumption in the power amplifier is in agreement with said reference voltage independently of the real internal resistance of the power amplifier, and so that the same applies to the output power of the power amplifier which is proportional to the power consumption by a substantially fixed efficiency factor.

2. A device as claimed in claim 1, characterized in that the stabilizer circuit is equivalent to said nominal resistance which is arranged between a terminal receiving said reference voltage and a DC supply terminal of the power amplifier circuit, so that the DC supply voltage of the power amplifier having a power generated on said terminal is equal to the reference voltage diminished by the voltage drop in this nominal resistance which is passed through by the working current of the amplifier circuit.

3. A device as claimed in claim 2, characterized in that the stabilizer circuit is arranged as a loop between the terminal receiving the reference voltage and the supply voltage terminal of the power amplifier with reducing means for reducing the power consumption in this actual stabilizer circuit.

4. A device as claimed in claim 3, characterized in that the means for reducing the power consumption in the actual stabilizer circuit comprise a branch connected, on the one hand, to a battery which produces a DC supply voltage for the stabilizer circuit, and on the other hand, to the terminal for DC power supply of the power amplifier, this branch being passed through by the working current of the power amplifier, and including in a series combination a transistor having the function of variable resistor and a small resistance having a value substantially low compared with said nominal resistance in a range from $\frac{1}{20}$ to $\frac{1}{200}$.

5. Device as claimed in claim 4, characterized in that the stabilizer circuit arranged as a loop comprises in a first branch a first amplifier which receives the reference voltage and which controls the resistance of the transistor arranged as a variable resistor, and which includes in a second branch a second amplifier having a predetermined gain whose input terminals are connected to the terminals of said small resistance and whose output is connected as a second input to the first amplifier, the gain of the second amplifier being predetermined so that the product of this gain and the value of said small resistance is equal to the value of the nominal resistance.

6. A device as claimed in one of the claims 1 to 5, characterized in that the value of the nominal resistance is the average of the internal resistances of a manufactured batch of amplifier circuits of the same type.

7. A device as claimed in claim 6, characterized in that the power amplifiers of the manufactured batch of power amplifiers for realizing the device have predetermined dispersion coefficients in a range that corresponds to extreme current-voltage characteristics around the nominal current-voltage characteristic corresponding to the nominal resistance, these extreme characteristics being such that the intersections of the characteristics comprised between these extreme characteristics with a straight line tangential to an exact isopower curve at the point of intersection of this curve and the nominal characteristic curve determine pairs of current-voltage values substantially coinciding with the pairs of current-voltage values that are situated on the exact isopower curve, and in that said tangential straight line is a substantially exact isopower curve so that the pairs of current-voltage values of this straight line result from a constant power consumption of whatever amplifiers of the manufactured batch of amplifiers.

8. A device as claimed in claim 1, including a power amplifier circuit and a stabilizer circuit in a radio frequency transceiver circuit.

9. A device as claimed in claim 8, realized in gallium arsenide integrated circuit technology.

10. A mobile transceiver terminal device including a radio frequency device as claimed in claim 1.

\* \* \* \* \*